United States Patent [19]
Raynham

[11] Patent Number: 5,682,298
[45] Date of Patent: Oct. 28, 1997

[54] BALANCING POWER DISTRIBUTION IN A POWER SUPPLY SYSTEM WITH REDUNDANT POWER SOURCES

[75] Inventor: Michael B. Raynham, Los Gatos, Calif.

[73] Assignee: Hewlett-Packard Company, Palo Alto, Calif.

[21] Appl. No.: 664,074

[22] Filed: Jun. 13, 1996

[51] Int. Cl.⁶ .................................................. H05K 1/00
[52] U.S. Cl. ..................... 361/794; 361/792; 361/795; 361/788; 361/826; 174/250; 174/260; 174/261; 174/72 A
[58] Field of Search ........................ 361/792, 794, 361/795, 785, 826, 777, 818, 748, 778, 780; 174/250, 260, 261, 72 A, 255, 35 R; 333/181, 182, 184, 185, 246, 247; 439/68, 609, 108, 105

[56] References Cited

U.S. PATENT DOCUMENTS

| | | | |
|---|---|---|---|
| 3,628,095 | 12/1971 | Schwartz | 361/826 |
| 5,117,331 | 5/1992 | Gebara | 361/785 |
| 5,308,926 | 5/1994 | Auerbach | 174/250 |
| 5,365,407 | 11/1994 | Nakabayashi | 361/794 |
| 5,376,759 | 12/1994 | Marx | 361/794 |
| 5,390,081 | 2/1995 | St. Pierre | 361/792 |
| 5,448,020 | 9/1995 | Pendse | 361/794 |
| 5,453,583 | 9/1995 | Rostoker | 361/777 |
| 5,457,610 | 10/1995 | Bernardoni | 361/818 |
| 5,475,606 | 12/1995 | Muyshondt | 174/260 |
| 5,488,540 | 1/1996 | Hatta | 361/794 |
| 5,497,037 | 3/1996 | Lee | 361/794 |
| 5,561,584 | 10/1996 | Tang | 361/792 |
| 5,587,887 | 12/1996 | Price | 361/794 |
| 5,616,967 | 4/1997 | Lee | 361/794 |

*Primary Examiner*—William M. Shoop, Jr.
*Assistant Examiner*—Peter Ganjian

[57] ABSTRACT

Within a power supply, the draw of power between redundant power sources are passively balanced. Within a power plane of the printed circuit board a first current distribution plane section is placed. First connector pins are used to electrically connect the first current distribution plane to the first power source. Second connector pins are used to electrically connect the first current distribution plane to the second power source. Moats are placed within the power plane of the printed circuit board so that within the first current distribution plane section a first current path from the first connector pins to a first central power distribution area is substantially symmetrical to a second current path from the second connector pins to the first central power distribution area. Output power current passes through the first central power distribution area.

14 Claims, 3 Drawing Sheets

BALANCING POWER DISTRIBUTION IN A POWER SUPPLY SYSTEM WITH REDUNDANT POWER SOURCES

BACKGROUND

The present invention concerns power supply systems and pertains particularly to the balancing of power distribution in a power supply system with redundant power sources.

Computing systems generally require sophisticated power supplies which are able to deliver a plurality of voltage levels to various connectors on a power supply board. For computing systems which require a great deal of reliability, redundant power sources may be placed on a single power supply board. For example, when two redundant power sources are placed on a single power supply board, each power source is able to supply full power for the computing system. This allows the computing system to continue operation even when a single power source fails.

In general, the reliability of the power supplies is proportional to the operating temperature of the components including active devices and magnetic devices. When both power supplies in a redundant power source system are operating, the greatest reliability is generally achieved when power drawn through each power supply is roughly equal. This can be achieved, for example, through active circuitry. However the use of active circuitry requires the use of additional interconnections within the power supply board. This use of additional interconnections and active circuitry in each power supply reduces the reliability of the power supply system.

BRIEF SUMMARY OF THE INVENTION

In accordance with the preferred embodiment of the present invention, within a power supply, the draw of power between redundant power sources is passively balanced. Within a power plane of the printed circuit board a first current distribution plane section is placed. First connector pins are used to electrically connect the first current distribution plane to the first power source. Second connector pins are used to electrically connect the first current distribution plane to the second power source. Moats are placed within the power plane of the printed circuit board so that within the first current distribution plane section a first current path from the first connector pins to a first central power distribution area is approximately symmetrical to a second current path from the second connector pins to the first central power distribution area. Output power current passes through the first central power distribution area.

In the preferred embodiment of the present invention, dummy fill areas are formed within first current distribution plane section where necessary to achieve symmetry between the current paths. Also, within the first current distribution plane section more than one central distribution area may be utilized. For example, the first current distribution plane section may include a third current path from the first connector pins to a second central power distribution area which is approximately symmetrical to a fourth current path from the second connector pins to the second central power distribution area.

In addition, the power plane may include additional current distribution plane sections with symmetrical current paths. For example, a second current distribution plane section is within the power plane of the printed circuit board. Third connector pins connect the second current distribution plane to the first power source. Fourth connector pins electrically connect the second current distribution plane to the second power source. The moats within the power plane of the printed circuit board are arranged so that within the second current distribution plane section a third current path from the third connector pins to a second central power distribution area is approximately symmetrical to a fourth current path from the fourth connector pins to the second central power distribution area. Output power utilizes current which passes through the second central power distribution area. For example, the first current distribution plane section is used to supply a first power signal with a first output voltage which is different than a second output voltage for a second power signal which the second current distribution plane section is used to supply.

From the central power distribution area, the current is distributed to a power output connector located asymmetrically on the printed circuit board. For example, the output power travels from the first central power distribution area through first layer interconnection pins to a conductor section on another plane of the printed circuit, through the conductor section to second layer interconnection pins, to a second current distribution plane section within the power plane of the printed circuit board, to pins of a power output connector. Alternatively, the output power travels from the first central power distribution area through first layer interconnection pins to a conductor section on another plane of the printed circuit, through the conductor section to pins of a power output connector.

The present invention provides a reasonable current sharing ratio between two power sources, typically within 45% to 55% range. The resulting power supply is more reliable than power supplies which rely on active current sharing schemes to balance power consumption.

DETAILED DESCRIPTION OF THE PREFERRED EMBODIMENT

Figure 1:
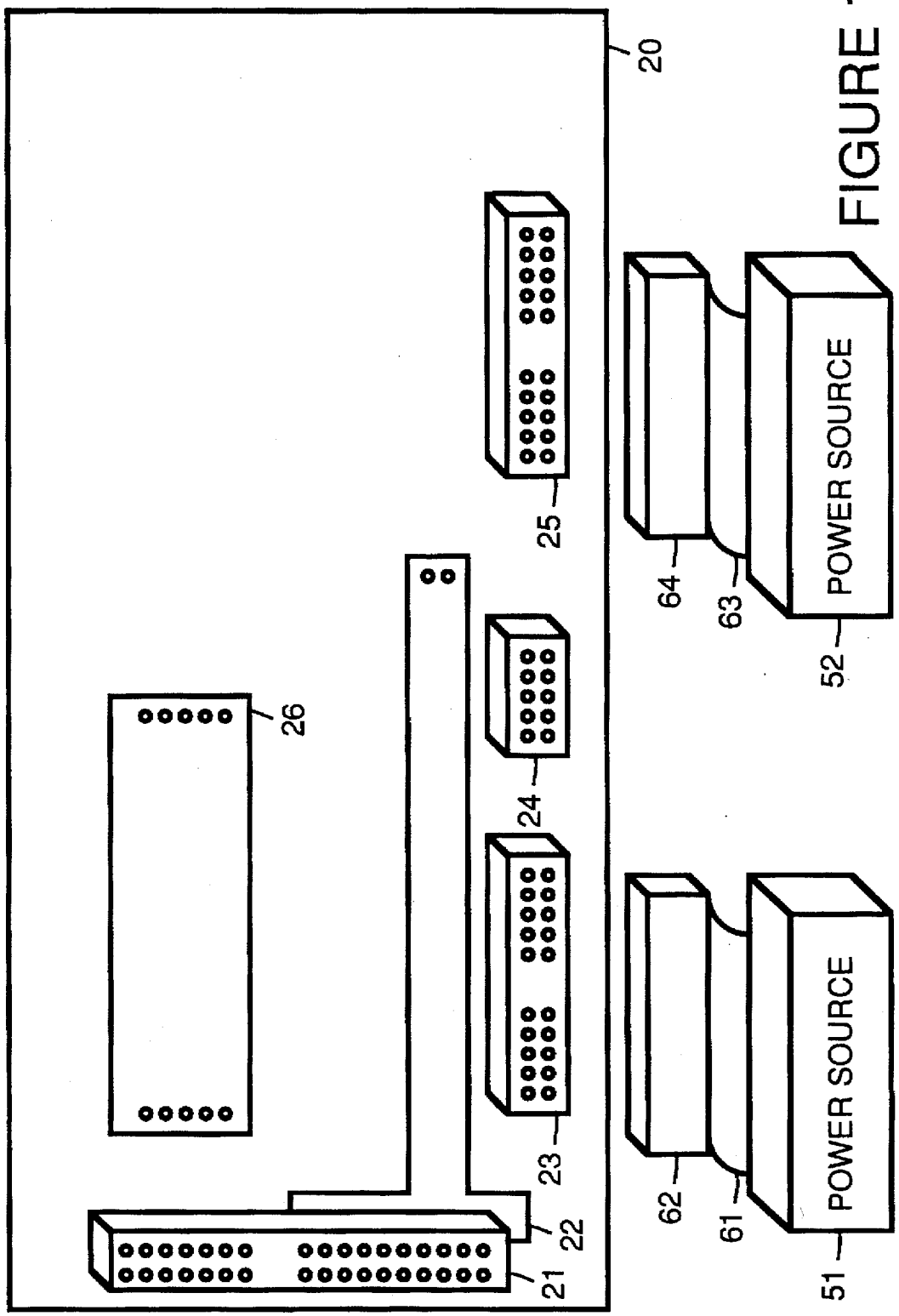
FIG. 1 is a simplified view of connectors placed on a power supply printed circuit board in accordance with a preferred embodiment of the present invention.

FIG. 1 is a simplified view of the top of a power supply printed circuit board 20 in accordance with a preferred embodiment of the present invention. For example, power supply printed circuit board (PCB) 20 has four layers, a top layer, a 5 volt/12 volt plane, a ground plane and a 3.3 volt plane. In a preferred embodiment, the power supply system which includes power supply printed circuit board 20 is capable of supplying 20 amps of current at 12 volts, 45 amps at 5 volts and 33 amps at 3.3 volts. In FIG. 1, the circuitry on the top of power supply printed circuit board 20 is shown in simplified form in order to more clearly describe the innovative features of the present invention.

Various connectors are shown on the top of power supply printed circuit board 20. For example, a connector 23 is used to attach to a connector 62 of a power supply 51. Power supply 51 is electrically connected to connector 62 via a flat copper power cable 61. A connector 25 is used to attach to a connector 64 of a power supply 52. Power supply 52 is electrically connected to connector 64 via a flat copper power cable 63. A power output connector 21 is used to provide power to entities within the computing system. In the preferred embodiment, power output connector 21 include pins which supply power at 12 volts, pins which supply power at 5 volts, pins which supply power at 3.3 volts and a ground return path. A power output connector 24 is also used to provide power to entities within the computing system. In the preferred embodiment, power output connector 24 include pins which supply power at 5 volts.

Also shown on the top of power supply printed circuit board 20 are a conductor section 26 and a conductor section 22. Conductor section 26 is used to electrically connect two 5 volt distribution planes, as is further described in conjunction with the discussion of FIG. 2 below. Conductor section 22 is used to connect a 12 volt distribution plane, shown in FIG. 2, to 12 volt pins within PCB connector 22. In various embodiments of the present invention, additional circuitry and connectors are also present on the top of power supply printed circuit board 20.

Figure 2:
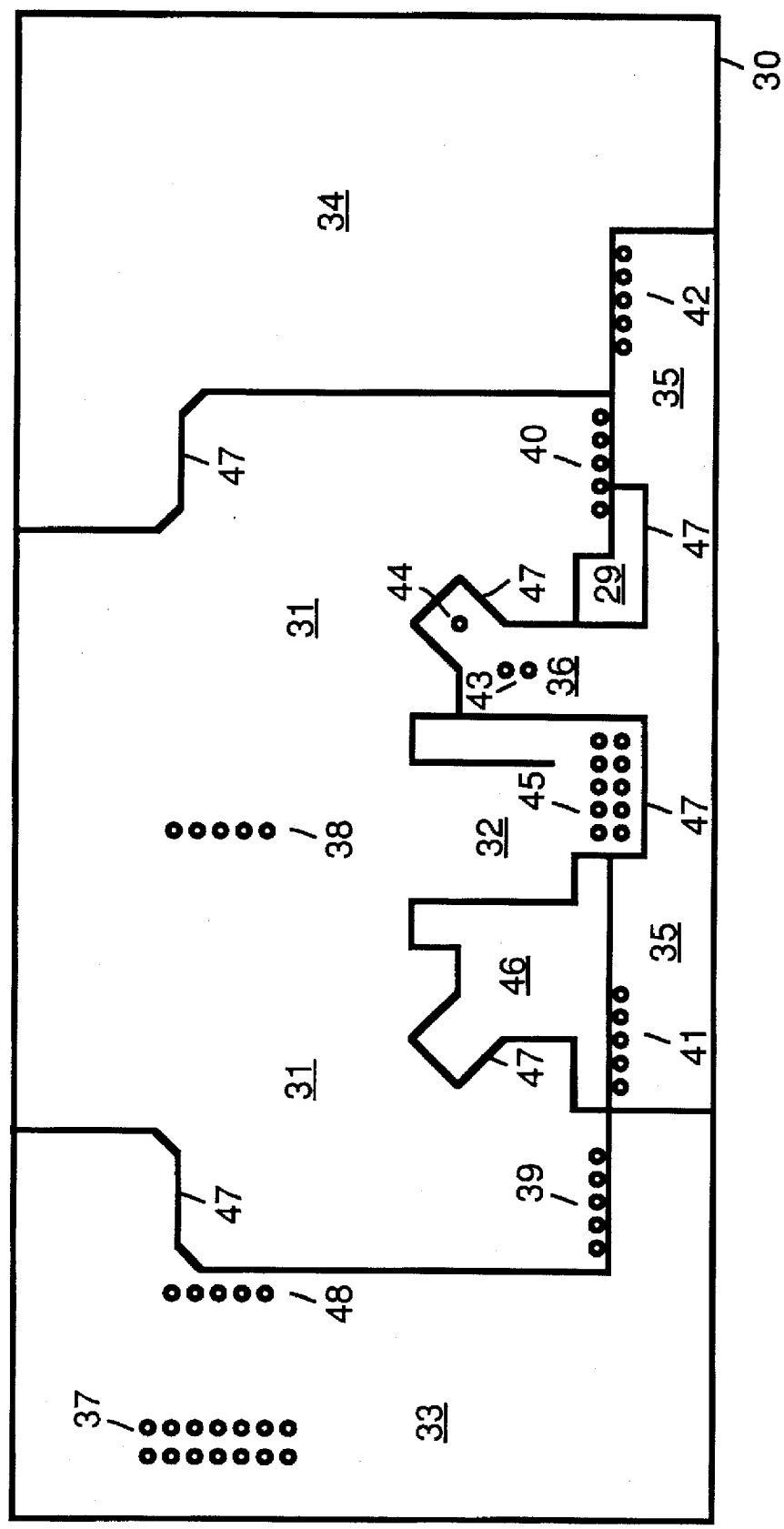
FIG. 2 is a simplified view of a connection layer of the power supply printed circuit board in accordance with a preferred embodiment of the present invention.

FIG. 2 shows a 5 volt/12 volt plane 30 of power supply printed circuit board 20. In FIG. 2, the circuitry on 5 volt/12 volt plane 30 is shown in simplified form in order to more clearly describe the innovative features of the present invention. Moats 47 are used to separate various distribution plane sections within 5 volt/12 volt plane 30. For example, FIG. 2 shows a 5 volt distribution plane section 33, a 5 volt distribution plane section 31, a 12 volt distribution plane section 35, a dummy fill plane section 34, a dummy fill plane section 29 and a dummy fill plane section 46.

On 5 volt/12 volt plane 30, a passive scheme using printed circuit board geometries is used to construct a balanced power distribution scheme even though the location of power supply connectors 23 and 25, and power output connectors 21 and 24 are asymmetrically located on the top of power supply printed circuit board 20. The goal is to balance the resistance between the power supply connector pins and the power distribution points.

The resistance is balanced by shaping the power distribution planes to provide substantially symmetrical current paths from pins of the power supply connectors to a central distribution area within the power distribution planes. The current passes through a central distribution area before being distributed to a power supply connector or other power distribution point.

For example, in FIG. 2, in 12 volt distribution plane section 35, substantially symmetrical current paths exist from the location of 12 volt power pins 41 of connector 23 to a central distribution area 36 and from the location of 12 volt power pins 42 of connector 25 to central distribution area 36. Once the current has passed through central distribution area 36 the current runs through pins 43 to conductor section 22. Also, once the current has passed through central distribution area 36 the current also runs through pin 44 which may then be connected to another power distribution point.

Likewise, in FIG. 2, in 5 volt distribution plane section 31, substantially symmetrical current paths exist from the location of 5 volt power pins 39 of connector 23 to a central distribution area in which is located distribution pins 38 and from the location of 5 volt power pins 40 of connector 25 to the central distribution area in which is located distribution pins 38. Once the current has passed through distribution pins 38 the current runs through conductor section 26 through pins 48 to 5 volt power distribution plane 33. The current then flows through to 5 volt pins 37 of power output connector 21.

In addition, 5 volt distribution plane section 31 includes a second central distribution area 32. Substantially symmetrical current paths exist from the location of 5 volt power pins 39 of connector 23 to central distribution area 32 and from the location of 5 volt power pins 40 of connector 25 to central distribution area 32. Once the current has passed through central distribution area 32, the current runs through pins 45 of power output connector 24.

The location moats 47 are carefully selected in order to construct the substantially symmetrical current paths from pins of the power supply connectors to the central distribution areas within the power distribution planes. In addition, dummy fill plane sections are added to achieve symmetry. As discussed above, in FIG. 2, on 5 volt/12 volt plane 30 three dummy fill sections 29, 34 and 46 have been added. There is no current flow through dummy fill section 29, dummy fill section 34 or dummy fill section 46.

As mentioned above, the connector pins and circuitry shown in FIG. 2 are simplified in order to more clearly illustrate the present invention. For example, various via holes placed through 5 volt distribution plane section 31 are present but not shown in FIG. 2.

FIG. 2 illustrates the use of the present invention for 5 volt/12 volt plane 30. While not shown, it is clear that the principles of the present invention can be extended to the ground plane and the 3.3 volt plane of printed circuit board 20.

Figure 3:
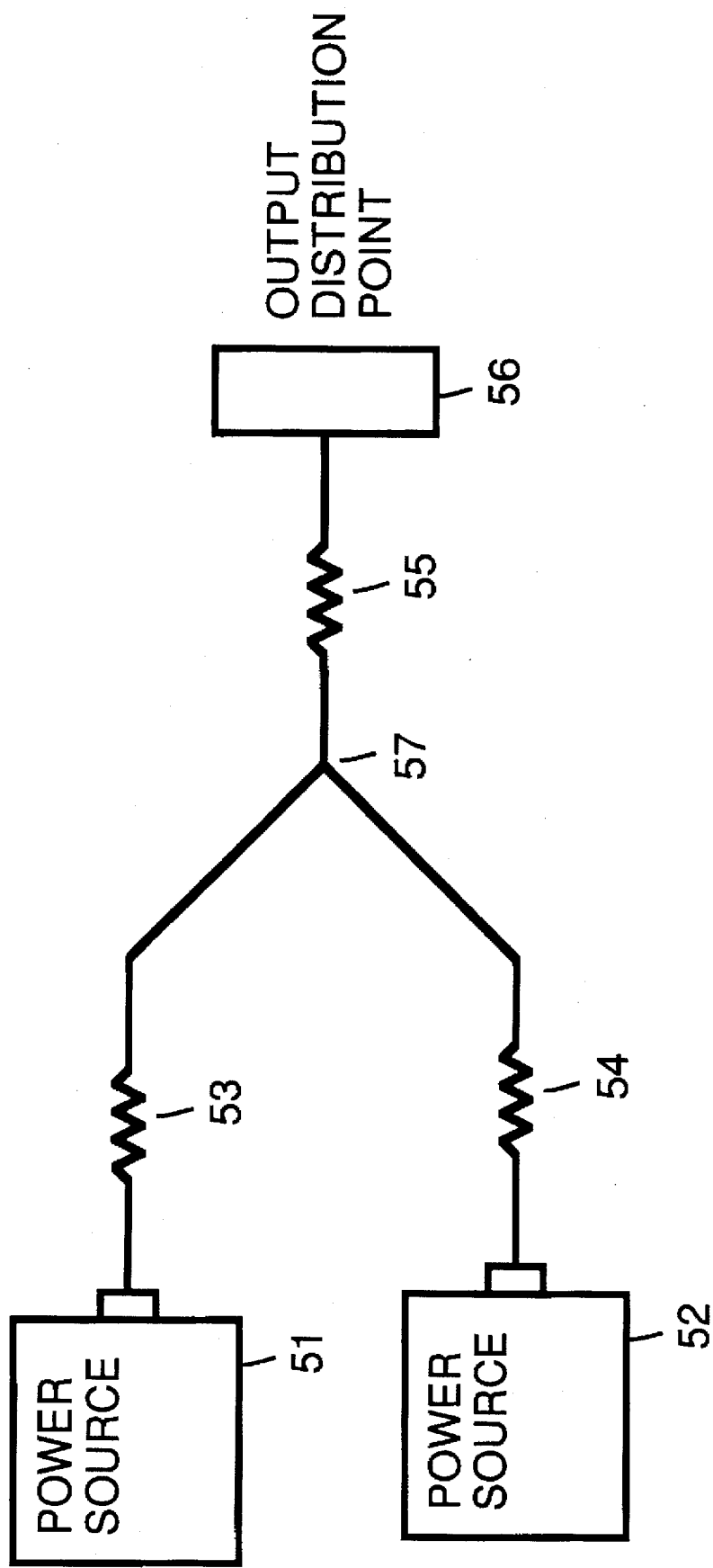
FIG. 3 is a simplified block diagram which illustrates the balancing of power distribution in a system with redundant power supplies in accordance with a preferred embodiment of the present invention.

FIG. 3 is a block diagram which illustrates current flow within printed circuit board 20. In a particular current path, resistor 53 represents resistance in a current path between power source 51 and a central distribution area 57. In a second current path, resistor 54 represents resistance in a current path between power source 52 and central distribution area 57. Resistor 55 represents resistance in a current path between central distribution area 57 and an output distribution point 56.

The current paths from power source 51 to central distribution area 57 and from power source 52 to central distribution area 57 are constructed to be substantially similar so that resistance 53 is approximately equal to resistance 54. This assures that current drawn form power source 51 is essentially equal to the current drawn from power source 52.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for providing a substantially balanced draw of power between a first power source and a second power source, each connected to a printed circuit board, the method comprising the following steps:

(a) placing a first current distribution plane section within a power plane of the printed circuit board;

(b) electrically connecting first connector pins to the first current distribution plane and to the first power source;

(c) electrically connecting second connector pins to the second current distribution plane and to the second power source;

(d) placing moats within the power plane of the printed circuit board so that within the first current distribution plane section a first current path from the first connector pins to a first central power distribution area is substantially symmetrical to a second current path from the second connector pins to the first central power distribution area; and, (e) providing output power utilizing current which passes through the first central power distribution area.

2. A method as in claim 1 wherein step (d) includes the following substep:

forming dummy fill areas within the first current distribution plane section.

3. A method as in claim 1 wherein in step (d) the moats are placed so that within the first current distribution plane section a third current path from the first connector pins to a second central power distribution area is substantially symmetrical to a fourth current path from the second connector pins to the second central power distribution area.

4. A method as in claim 1 additionally comprising the following steps:

(f) placing a second current distribution plane section within the power plane of the printed circuit board;

(g) electrically connecting third connector pins to the second current distribution plane and to the first power source;

(h) electrically connecting fourth connector pins to the second current distribution plane and to the second power source;

(i) placing the moats within the power plane of the printed circuit board so that within the second current distribution plane section a third current path from the third connector pins to a second central power distribution area is substantially symmetrical to a fourth current path from the fourth connector pins to the second central power distribution area; and, (j) providing output power utilizing current which passes through the second central power distribution area.

5. A method as in claim 4 wherein the first current distribution plane section is used to supply a first power signal with a first output voltage which is different than a second output voltage for a second power signal which the second current distribution plane section is used to supply.

6. A method as in claim 1, wherein in step (e) the output power travels from the first central power distribution area through first layer interconnection pins to a conductor section on another plane of the printed circuit, through the conductor section to second layer interconnection pins, to a second current distribution plane section within the power plane of the printed circuit board, to pins of a power output connector.

7. A method as in claim 1, wherein in step (e) the output power travels from the first central power distribution area through first layer interconnection pins to a conductor section on another plane of the printed circuit, through the conductor section to pins of a power output connector.

8. A power supply for providing power to a computing system, comprising:

a first power source connector for receiving a first power signal from a first power source;

a second power source connector for receiving a second power signal from a second power source;

a printed circuit board on which is placed the first power source connector and the second power source connector, the printed circuit board including a power plane, the power plane including a first current distribution plane section, and moats placed within the power plane of the printed circuit board, the moats being placed so that within the first current distribution plane section, a first current path from first connector pins of the first connector to a first central power distribution area is substantially symmetrical to a second current path from second connector pins of the second connector to the first central power distribution area.

9. A power supply as in claim 8 wherein the moats are additionally placed to form dummy fill areas within the first current distribution plane section.

10. A power supply as in claim 8 wherein the moats are placed so that within the first current distribution plane section, a third current path from the first connector pins of the first connector to a second central power distribution area is symmetrical to a fourth current path from the second connector pins of the second connector to the second central power distribution area.

11. A power supply as in claim 8 wherein the power plane additionally includes:

a second current distribution plane section within the power plane of the printed circuit board;

wherein the moats are placed so that within the second current distribution plane section, a third current path from third connector pins of the first connector to a second central power distribution area is substantially symmetrical to a fourth current path from fourth connector pins of the second connector to the second central power distribution area.

12. A power supply as in claim 11 wherein the first current distribution plane section is used to supply a first power signal with a first output voltage which is different than a second output voltage for a second power signal which the second current distribution plane section is used to supply.

13. A power supply as in claim 8, wherein the printed circuit board additionally comprises:

a second plane, on which is placed a conductor, the conductor being electrically coupled by first layer interconnection pins to the first central power distribution area and by second layer interconnection pins to a second current distribution plane section within the power plane of the printed circuit board.

14. A power supply as in claim 8, wherein the printed circuit board additionally comprises:

a second plane, on which is placed a conductor, the conductor being electrically coupled by first layer interconnection pins to the first central power distribution area and by second layer interconnection pins to a power output connector placed on the printed circuit board.

* * * * *